United States Patent
Bolik et al.

(10) Patent No.: US 9,197,025 B2
(45) Date of Patent: Nov. 24, 2015

(54) CONTROL UNIT HOUSING AND PRODUCTION METHOD

(71) Applicant: WABCO GmbH, Hannover (DE)

(72) Inventors: Thomas Bolik, Hannover (DE); Christian Brammer, Bergen (DE); Sylwester Piasecki, Swidnica (PL); Dominik Szczerba, Domaslaw (PL)

(73) Assignee: WABCO GmbH, Hannover (DE)

( * ) Notice: Subject to any disclaimer, the term of this patent is extended or adjusted under 35 U.S.C. 154(b) by 0 days.

(21) Appl. No.: 14/369,861

(22) PCT Filed: Nov. 28, 2012

(86) PCT No.: PCT/EP2012/004892
§ 371 (c)(1),
(2) Date: Jun. 30, 2014

(87) PCT Pub. No.: WO2013/110301
PCT Pub. Date: Aug. 1, 2013

(65) Prior Publication Data
US 2014/0364012 A1  Dec. 11, 2014

(30) Foreign Application Priority Data

Jan. 26, 2012  (DE) .......................... 10 2012 001 478

(51) Int. Cl.
| | |
|---|---|
| *H01R 24/00* | (2011.01) |
| *H01R 43/20* | (2006.01) |
| *H05K 5/00* | (2006.01) |
| *H01R 12/72* | (2011.01) |
| *H01R 13/04* | (2006.01) |
| *H01R 13/52* | (2006.01) |

(52) U.S. Cl.
CPC .............. *H01R 43/205* (2013.01); *H01R 12/72* (2013.01); *H01R 13/04* (2013.01); *H01R 13/521* (2013.01); *H05K 5/0043* (2013.01); *H05K 5/0069* (2013.01); *Y10T 29/49153* (2015.01)

(58) Field of Classification Search
CPC ...... H01R 43/205; H01R 43/20; H01R 13/04; H01R 13/521; H01R 13/52; H01R 12/72; H05K 5/0043; H05K 5/0069; Y10T 29/49153
USPC ................ 439/629, 76.1, 79, 751, 82; 29/845
See application file for complete search history.

(56) References Cited

U.S. PATENT DOCUMENTS 5,118,300 A * 6/1992 Zarreii ............................ 439/79
5,924,896 A * 7/1999 Arnett et al. .................. 439/676

FOREIGN PATENT DOCUMENTS

| | | |
|---|---|---|
| DE | 101 29 451 A1 | 1/2003 |
| EP | 1 895 823 A1 | 3/2008 |
| WO | WO 2009/010705 A1 | 1/2009 |

OTHER PUBLICATIONS

Machine translation of DE 10129451MT. May 7, 2015.*

*Primary Examiner* — Javaid Nasri
(74) *Attorney, Agent, or Firm* — Kramer Levin Naftalis & Frankel LLP

(57) ABSTRACT

A control unit housing has connector pins arranged therein. Each pin has a first contact end directed to the housing interior for a press-fit connection to a circuit board insertable therein, and a second contact end directed out of the housing for connecting an electrical plug connector or the like. The housing is designed as a header that is open on one side and has an access opening for inserting the circuit board. The access opening can be closed by a cover after mounting the circuit board. The connector pins are substantially right-angled pins arranged in the region of a side wall of the housing. The pins are anchored in the housing by the second contact ends running approximately at right angles to the first contact ends, such that the mounting forces acting on the first contact ends during press-fit connecting are received by the housing.

18 Claims, 1 Drawing Sheet

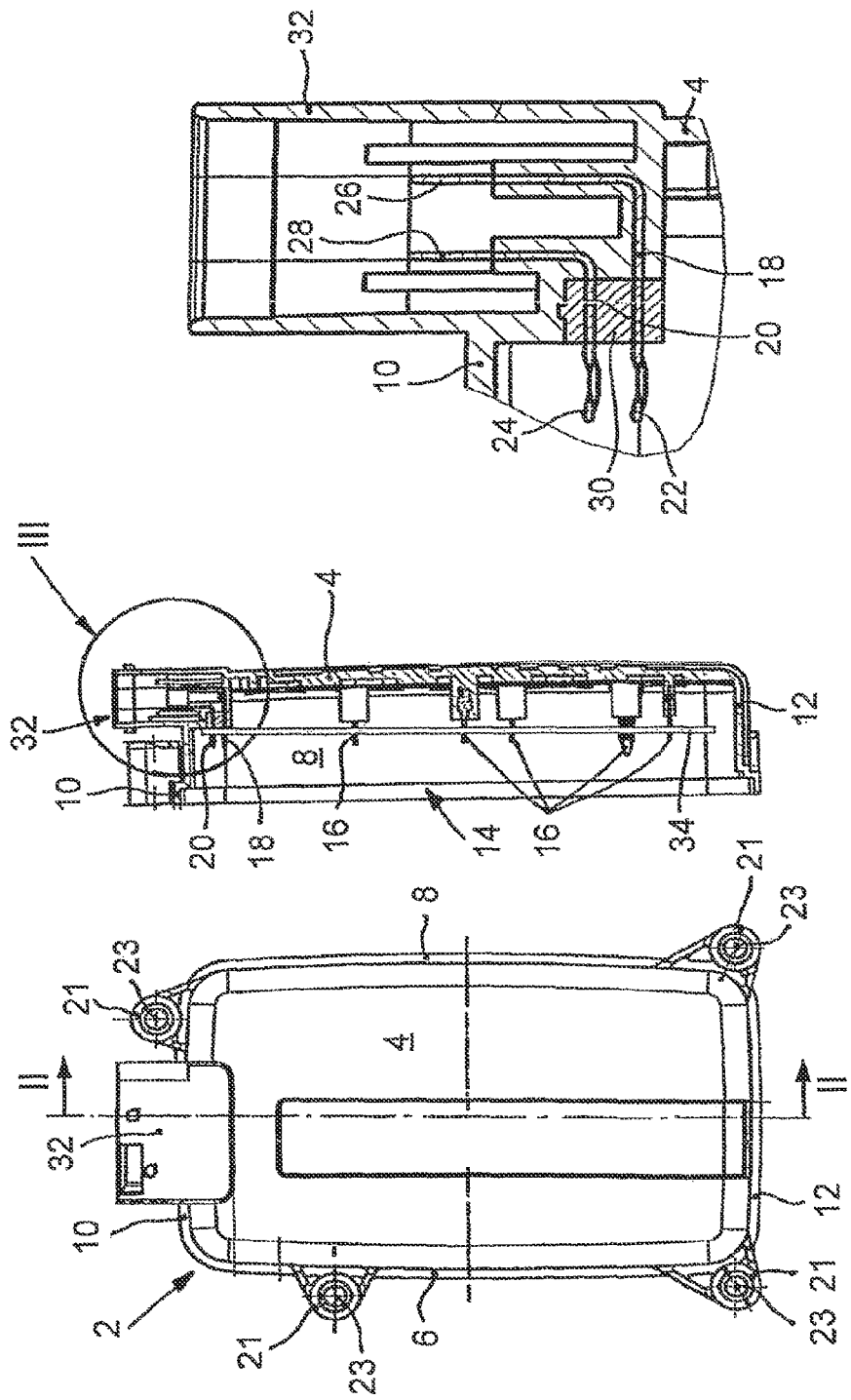

CONTROL UNIT HOUSING AND PRODUCTION METHOD

FIELD OF THE INVENTION

The invention generally relates to a control unit housing and method of producing a control unit housing.

BACKGROUND OF THE INVENTION

Control unit housings are used in modern vehicle construction where they accommodate, for example, control components of the vehicle control system, the components being connected by means of plug connectors to sensors and to the functional elements that are to be controlled. After a printed circuit board that accommodates an electronic circuit is inserted into the control unit housing, the control unit housing is closed in a media-tight manner by means of a suitable cover and seals associated with the cover in order to protect the control system against unfavorable environmental conditions. A known control unit housing of the general type under consideration includes, for example, a plug frame that is open on two sides and that has material projections formed therein for receiving plug pins. The material projections contain passage holes or the like into which plug pins are directly inserted such that the two contact ends of the plug pins project out of the associated passage holes. A first contact end directed into the housing interior for a press-fit connection is provided with a printed circuit board that is to be inserted into the control unit housing. The second contact end projects out of the control unit housing, which is closed after the printed circuit board is mounted, and is provided for the connection of a plug connector.

One disadvantage of such known control unit housing is that the mounting force that acts on the plug pins during mounting of the printed circuit board by means of a press-fit connection has to be absorbed by associated submatrices on which the plug pins are supported by means of shoulders, which are formed on the plug pins, this being relatively complicated in respect of mounting. In addition, it is absolutely necessary, because of the described mounting technique, for the control unit housing to initially be in the form of a plug frame with two access openings, in which plug frame the access opening opposite the access opening for inserting the printed circuit board is required for arranging the submatrices. In order to close the control unit housing in a media-tight manner after mounting of the printed circuit board, two covers, each with an associated seal, are required.

SUMMARY OF THE INVENTION

Generally speaking, it is an object of the present invention to provide an improved control unit housing and a method for producing such housing that permit simple mounting of the plug pin in the control unit housing, provide a simplified press-fit connection of the printed circuit board to the plug pins, and that render a second access opening, and therefore a second cover together with its associated seal, superfluous.

Applicant has determined that, by virtue of using plug pins, each of which is bent at a substantially right angle and is routed through a side wall of the control unit housing by way of its second contact end, the mounting force produced during the press-fit connection process of the printed circuit board can be absorbed by the housing directly without submatrices, and, as a result, a second access opening, which is situated opposite the first access opening, and therefore a second cover and also a second seal are no longer required.

Inventive embodiments accordingly include a method for producing a control unit housing having plug pins arranged in the control unit housing. Each plug pin has a first contact end, which is directed into the housing interior, for a press-fit connection to a printed circuit board to be inserted into the control unit housing. Each plug pin also has a second contact end, which is directed outward out of the control unit housing, for the connection of an electrical plug connector or the like. The control unit housing can be in the form of a plug receptacle, which is open on one side, having an access opening for inserting the printed circuit board. The plug pins are bent at substantially right angles and are arranged in the region of a side wall of the control unit housing such that the first contact ends of the plug pins are oriented toward the access opening and the second contact ends of the plug pins project outward through the side wall.

As noted above, the plug pins can directly absorb the mounting force produced during the press-fit connection process of the printed circuit board by means of their second contact ends, which are anchored in a side wall of the control unit housing, with the result that a submatrix for absorbing these mounting forces is not required. As a result, a second access opening, which is situated opposite the first access opening, and therefore a cover and also a seal for closing a second access opening of this kind, can be dispensed with.

The control unit housing is preferably produced from a plastic, although it can also be produced from a metal. The respective material selection depends on the variables that act on the control unit housing from the outside.

According to one embodiment of the present invention, the plug pins are connected to the control unit housing by injection-molding encapsulation with a plastic. The injection-molding encapsulation is preferably performed during production of the control unit housing during a plastic injection-molding process. Injection-molding encapsulation of plastic articles that are produced by injection molding constitutes a particularly simple method for inserting metal plug pins into the control unit housing and ensures particularly deep anchoring of these plug pins in the plastic material.

According to another embodiment, a plurality of plug pins can be arranged on a common plug pin carrier. The assembly formed from the plug pin carrier and plug pins can be connected, as a whole, to the control unit housing by injection-molding encapsulation with plastic. By virtue of the plug pins being combined to form one assembly, the plug pins are already provided with the exact mutual arrangement and orientation that they are later intended to have in the control unit housing, with the result that manufacture is considerably simplified in comparison to arrangement and orientation of individual plug pins in an injection mold for the control unit housing.

The plug pins can be connected to the plug pin carrier by a mounting process, for example by being pressed in. According to another method, which is simpler in respect of manufacture, the plug pins and the plug pin carrier can be connected to one another in a plastic injection-molding process. The plug pin carrier is then connected in a force-fitting and interlocking manner to the control unit housing by a second injection-molding process or by being clipped.

To design the second contact ends to form a plug arrangement that can be connected to a mating plug, according to a further embodiment of the present invention, a plug connector housing can surround these second contact ends of the plug pins and be open toward the outside to be injection-molded with plastic onto an outer wall of the control unit housing.

The connection between the plug pins and the control unit housing, or the connection between the plug pins and the plug pin carrier, and also the connection between the plug pin carrier and the control unit housing are preferably made such that no media, such as air, water or oil, can enter the control unit housing from the outside.

An inventive production method accordingly provides a control unit housing having plug pins arranged therein. Each plug pin has a first contact end, which is directed into the housing interior, for a press-fit connection to a printed circuit board to be inserted into the control unit housing. Also, each plug pin has a second contact end, which is directed outward out of the control unit housing, for the connection of a plug connector or the like. The control unit housing can be in the form of a plug receptacle, which is open on one side, having only one access opening for inserting the printed circuit board, wherein the plug pins are bent at substantially right angles and the pins are arranged in the region of a side wall of the control unit housing such that the first contact ends of the plug pins are, in each case, oriented toward the access opening, and the second contact ends of the plug pins project outward through the side wall.

The printed circuit board, which is provided with the receiving openings associated with the plug pins, is pressed onto the plug pins through the access opening (press-fit connection). The mounting forces that act on the plug pins in the process are absorbed by the plug pins themselves by means of the bent-away second contact ends that are anchored in the plug wall. A single cover, which is provided with a corresponding seal and which is fitted on the access opening, suffices to close the control unit housing.

As discussed above, the plug pins are preferably combined with a common plug pin carrier by mounting or injection-molding encapsulation with plastic to form an assembly and, as a whole, are connected in a force-fitting and interlocking manner to the control unit housing with plastic or by being clipped. A plug connector housing that surrounds the second contact ends of the assembly is preferably arranged on the side wall of the control unit housing associated with the second contact ends of the plug pin, it being possible for a mating plug to be inserted into the plug connector housing and to be electrically connected to the second contact ends.

The connection between the plug pins and the control unit housing or the connection between the plug pins and the plug pin carrier, and also the connection between the plug pin carrier and the control unit housing, are preferably provided in a sealed off manner such that media, such as air, water or oil, are prevented from entering the control unit housing from the outside.

Still other objects and advantages of the present invention will in part be obvious and will in part be apparent from the specification.

The present invention accordingly comprises the features of construction, combination of elements, arrangement of parts, and the various steps and the relation of one or more of such steps with respect to each of the others, all as exemplified in the constructions herein set forth, and the scope of the invention will be indicated in the claims.

BRIEF DESCRIPTION OF THE DRAWINGS

The invention is discussed in greater detail below with reference to the accompanying drawings, in which:

FIG. 1 shows a tub-like control unit housing according to an embodiment of the present invention looking at the outside of the tub base;

FIG. 2 shows a section taken along section line II-II in FIG. 1; and

FIG. 3 is an enlarged view of area III in FIG. 2, which includes the electrical connection apparatuses of the control unit housing.

DETAILED DESCRIPTION OF THE PREFERRED EMBODIMENTS

As shown in FIGS. 1 and 2, the control unit housing 2 can be of tub-like design with a substantially rectangular footprint. The control unit housing 2 comprises a bottom wall 4, two long side walls 6, 8, which are connected to the bottom wall 4 and are situated opposite one another, and also two short side walls 10, 12, which are connected to the bottom wall 4 and are situated opposite one another.

Opposite the bottom wall 4, the control unit housing 2 has an access opening 14 through which a printed circuit board 34 comprising at least one electronic circuit can be inserted into the control unit housing 2 and connected to plug pins 18, 20, which are integrated into the control unit housing 2, by means of press-fit connections.

FIG. 2 shows an installed printed circuit board 34. The printed circuit board is connected to the plug pins 18, 20 and to the control unit housing 2 by retaining pins 16, which are arranged on the inside of the bottom wall 4 and are of different shapes, by means of press-fit connections.

Plug pins 18, 20, each of which is bent at a substantially right angle, are arranged in the region of one first short side wall 10. The first contact ends 22, 24 of the plug pins are oriented into the interior of the control unit housing 2 and toward the access opening 14, and the second contact ends 26, 28 of the plug pins project substantially through the first short side wall 10 to the outside, as will be explained further in detail with reference to FIG. 3. Projections 21 with threaded holes 23 are arranged on the outer sides of individual side walls, it being possible for fastening screws for fastening a cover that closes the access opening 14 to be screwed into the projections.

FIG. 3 is an enlarged illustration of detail III according to FIG. 2. Two plug pins 18 and 20, which lie in the sectional plane that corresponds to sectional line II-II, are shown. It should be noted here that the plug pins 18, 20 each constitute a plug pin from a series of plug pins, which are arranged one behind the other perpendicular to the plane of the drawing and which together form a plug pin group comprising two rows. By way of example, 12 plug pins can be arranged next to one another in each row.

It can be seen that the plug pins 18, 20 each have a first contact end 22, 24, which is oriented into the interior of the control unit housing 2 and toward the access opening 14, and also a second contact end 26, 28, which projects through the first short side wall 10 to the outside. The first contact ends 22, 24 are connected to a printed circuit board 34, which is to be inserted into the control unit housing 2, by means of a press-fit connection, whereas the second contact ends 26, 28 form a male electrical plug connector with which a female electrical mating plug or a female electrical plug socket makes contact.

As shown in FIG. 3, the plug pins 18, 20 are arranged on a common plug pin carrier 30, which, for its part, is fixedly connected to the control unit housing 2 by injection-molding encapsulation or by being clipped. The plug pins 18, 20 can be connected to the plug pin carrier 30 in any desired, suitable way, for example by a mounting process or preferably by a preliminary plastic injection-molding process, before the control unit housing 2 is injection-molded.

FIG. 3 shows that the contact ends 26, 28 of the plug pins 18, 20, which contact ends form the electrical plug connector, are surrounded by a plug connector housing 32 that is open toward the outside and that protects the contact ends 26, 28 and mechanically guides a female electrical plug connector when the plug connection is established. The plug connector housing 32 is injection-molded onto the control unit housing 2 during injection-molding of the control unit housing.

It will thus be seen that the objects set forth above, among those made apparent from the preceding description, are efficiently attained, and since certain changes may be made without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention that, as a matter of language, might be said to fall therebetween.

What is claimed is:

1. A method for producing a control unit housing, the method comprising configuring a housing as a plug receptacle, the housing having a side wall and an opening configured to receive a circuit board; providing plug pins, each of the plug pins having a first contact end directed into an interior region of the housing, the first contact end being configured to effect a press-fit connection to the circuit board, each of the plug pins having a second contact end directed outwardly from the housing, the second contact end being configured to connect with a connector, and each of the plug pins having a shape that is bent at substantially a right angle; and arranging the plug pins in a plug pin carrier as well as in a region of the side wall of the housing, such that the first contact end of each of the plug pins protrudes from the plug pin carrier toward the opening, and the second contact end of each of the plug pins projects outwardly through the side wall.

2. The method as claimed in claim 1, wherein the housing is made from a plastic.

3. The method as claimed in claim 1, wherein arranging the plug pins in the region includes connecting the plug pins to the housing by injection-molding encapsulation with plastic.

4. The method as claimed in claim 1, wherein arranging the plug pins in the region includes connecting the plug pin carrier with the plug pins to the housing by injection-molding encapsulation with plastic.

5. The method as claimed in claim 4, wherein arranging the plug pins in the plug pin carrier includes mounting the plug pins to the plug pin carrier.

6. The method as claimed in claim 4, wherein arranging the plug pins in the plug pin carrier includes connecting the plug pins to the plug pin carrier in a plastic injection-molding process.

7. The method as claimed in claim 4, further comprising sealing the housing against outside media via a connection between the plug pins and the plug pin carrier and a connection between the plug pin carrier and the housing.

8. The method as claimed in claim 1, further comprising injection-molding a plug connector housing, which surrounds the second contact ends of the plug pins and which is open toward the outside, onto an outer wall of the housing.

9. The method as claimed in claim 1, further comprising sealing the housing against outside media via a connection between the plug pins and the housing.

10. The method as claimed in claim 1, wherein the connector is an electrical plug connector.

11. A control unit housing, comprising a housing structure configured as a plug receptacle, the housing structure having a side wall and an opening configured to receive a circuit board; a plug pin carrier; and plug pins arranged in the housing structure, each of the plug pins having a first contact end directed into an interior region of the housing structure, the first contact end being configured to effect a press-fit connection to the circuit board, each of the plug pins having a second contact end directed outwardly from the housing structure, the second contact end being configured to connect with a connector, each of the plug pins having a shape that is bent at substantially a right angle, and the plug pins being arranged in the plug pin carrier as well as in a region of the side wall, such that the first contact end of each of the plug pins protrudes from the plug pin carrier toward the opening, and the second contact end of each of the plug pins projects outwardly through the side wall.

12. The control unit housing as claimed in claim 11, wherein the housing is made from a plastic.

13. The control unit housing as claimed in claim 12, wherein the plug pin carrier, along with the plug pins, is connected to the housing structure as an injection-molded plastic encapsulation.

14. The control unit housing as claimed in claim 13, wherein the plug pins and the plug pin carrier are connected as an injection-molded plastic encapsulation.

15. The control unit housing as claimed in claim 13, wherein a connection between the plug pins and the plug pin carrier and a connection between the plug pin carrier and the housing structure are configured to seal against outside media.

16. The control unit housing as claimed in claim 11, further comprising a plug connector housing surrounding the second contact ends of the plug pins and open toward the outside, the plug connector housing being arranged on the side wall of the housing structure.

17. The control unit housing as claimed in claim 11, wherein a connection between the plug pins and the housing structure is configured to seal against outside media.

18. The control unit housing as claimed in claim 11, wherein the connector is an electrical plug connector.

* * * * *